US012167537B2

(12) United States Patent
Oshikawa et al.

(10) Patent No.: US 12,167,537 B2
(45) Date of Patent: Dec. 10, 2024

(54) CIRCUIT BOARD UNIT, DETACHABLE UNIT, AND IMAGE FORMING APPARATUS

(71) Applicants: Yuki Oshikawa, Kanagawa (JP); Yuzuru Ozawa, Kanagawa (JP)

(72) Inventors: Yuki Oshikawa, Kanagawa (JP); Yuzuru Ozawa, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 558 days.

(21) Appl. No.: 17/478,965

(22) Filed: Sep. 20, 2021

(65) Prior Publication Data
US 2022/0095459 A1    Mar. 24, 2022

(30) Foreign Application Priority Data

Sep. 23, 2020    (JP) ................... 2020-158549

(51) Int. Cl.
  *H05K 1/14*    (2006.01)
  *G03G 15/08*    (2006.01)
(52) U.S. Cl.
  CPC ......... *H05K 1/142* (2013.01); *G03G 15/0863* (2013.01); *H05K 2201/09027* (2013.01)
(58) Field of Classification Search
  CPC ................. H05K 1/142; H05K 1/14
  USPC ........................................ 439/55
  See application file for complete search history.

(56) References Cited

U.S. PATENT DOCUMENTS

| 4,752,254 A | * | 6/1988 | Inoue | H05K 5/03 |
| | | | | 439/631 |
| 2005/0085104 A1 | * | 4/2005 | Stockhaus | H05K 1/147 |
| | | | | 439/67 |
| 2009/0135595 A1 | * | 5/2009 | Chen | F21K 9/232 |
| | | | | 362/249.02 |
| 2011/0243579 A1 | | 10/2011 | Oshikawa et al. | |
| 2012/0200871 A1 | * | 8/2012 | Takahashi | B41J 2/17546 |
| | | | | 358/1.9 |
| 2013/0141941 A1 | * | 6/2013 | Matsui | G02B 6/009 |
| | | | | 362/612 |
| 2014/0029973 A1 | | 1/2014 | Terazawa et al. | |
| 2015/0118890 A1 | * | 4/2015 | Oshikawa | H01R 13/17 |
| | | | | 399/90 |
| 2015/0273846 A1 | * | 10/2015 | Kubota | B41J 2/17513 |
| | | | | 347/86 |

(Continued)

FOREIGN PATENT DOCUMENTS

CN    203358049 U  *  12/2013
CN    203726995 U  *  7/2014

(Continued)

*Primary Examiner* — Peter G Leigh
*Assistant Examiner* — Amara Anderson
(74) *Attorney, Agent, or Firm* — XSENSUS LLP

(57) ABSTRACT

A circuit board unit includes a plurality of circuit boards disposed side by side with a gap in a direction substantially perpendicular to a predetermined direction in which the circuit board unit is detachably mounted to a body of an apparatus. At least one of the plurality of circuit boards includes an end-face terminal on an end face facing an adjacent one of the plurality of circuit boards. The end-face terminal is attachable to and detachable from a terminal of the apparatus that is inserted between an adjacent pair of the plurality of circuit boards in conjunction with a mounting operation of the circuit board unit to the body of the apparatus.

20 Claims, 7 Drawing Sheets

(56) References Cited

U.S. PATENT DOCUMENTS

2016/0192492 A1* 6/2016 Huang .................. H05K 1/142
  361/803
2019/0252810 A1* 8/2019 Holec .................. H01R 12/721

FOREIGN PATENT DOCUMENTS

| JP | 2007-199505 | 8/2007 | |
|---|---|---|---|
| JP | 2009-069417 | 4/2009 | |
| WO | WO-2018028411 A1 * | 2/2018 | .......... B41J 2/17503 |

\* cited by examiner

FIG. 16C′    CROSS-SECTIONAL VIEW ALONG LINE D-D

CIRCUIT BOARD UNIT, DETACHABLE UNIT, AND IMAGE FORMING APPARATUS

CROSS-REFERENCE TO RELATED APPLICATION

This patent application is based on and claims priority pursuant to 35 U.S.C. § 119(a) to Japanese Patent Application No. 2020-158549, filed on Sep. 23, 2020, in the Japan Patent Office, the entire disclosure of which is hereby incorporated by reference herein.

BACKGROUND

Technical Field

Embodiments of the present disclosure relate to a circuit board unit in which circuit boards such as integrated circuit (IC) chips are installed, detachable units such as toner containers including the circuit board unit, and an image forming apparatus such as a copying machine, a printer, a facsimile machine, a multifunction peripheral (MFP) that includes the functionality of the copying machine, the printer, and the facsimile machine, and a printing machine.

Description of the Related Art

An image forming apparatus such as a copying machine in which detachable units such as toner cartridges are detachably or replaceably mounted is widely known in the art. More specifically, each of such toner cartridges (detachable units) includes an IC-chip (circuit board) that stores, for example, the information related to the toner cartridges. As the toner cartridges are mounted on the body of the image forming apparatus, the IC chips of the toner cartridges and terminals of the image forming apparatus contact each other so as to communicate with each other. Thus, information can be exchanged between the toner cartridges and the image forming apparatus.

SUMMARY

In an aspect of the present disclosure, a circuit board unit includes a plurality of circuit boards disposed side by side with a gap in a direction substantially perpendicular to a predetermined direction in which the circuit board unit is detachably mounted to a body of an apparatus. At least one of the plurality of circuit boards includes an end-face terminal on an end face facing an adjacent one of the plurality of circuit boards. The end-face terminal is attachable to and detachable from a terminal of the apparatus that is inserted between an adjacent pair of the plurality of circuit boards in conjunction with a mounting operation of the circuit board unit to the body of the apparatus.

In another aspect of the present disclosure, a circuit board unit includes a plurality of circuit boards disposed side by side with a gap in a direction substantially perpendicular to a predetermined direction in which the circuit board unit is detachably mounted to a body of an apparatus. The plurality of circuit boards are connected to each other by one or more relays that enable electric communication between the plurality of circuit boards. At least one of the one or more relays includes a terminal configured to be attachable to and detachable from a terminal of the apparatus that is inserted between an adjacent pair of the plurality of circuit boards in conjunction with a mounting operation of the circuit board unit to the body of the apparatus.

In still another aspect of the present disclosure, a detachable unit includes the circuit board unit. The detachable unit is detachably installed on an image forming apparatus.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 16C' is a D-D cross-sectional view of the circuit board unit 80 of FIG. 16C according to a sixth modification of the above embodiments of the present disclosure.

Figure 1:
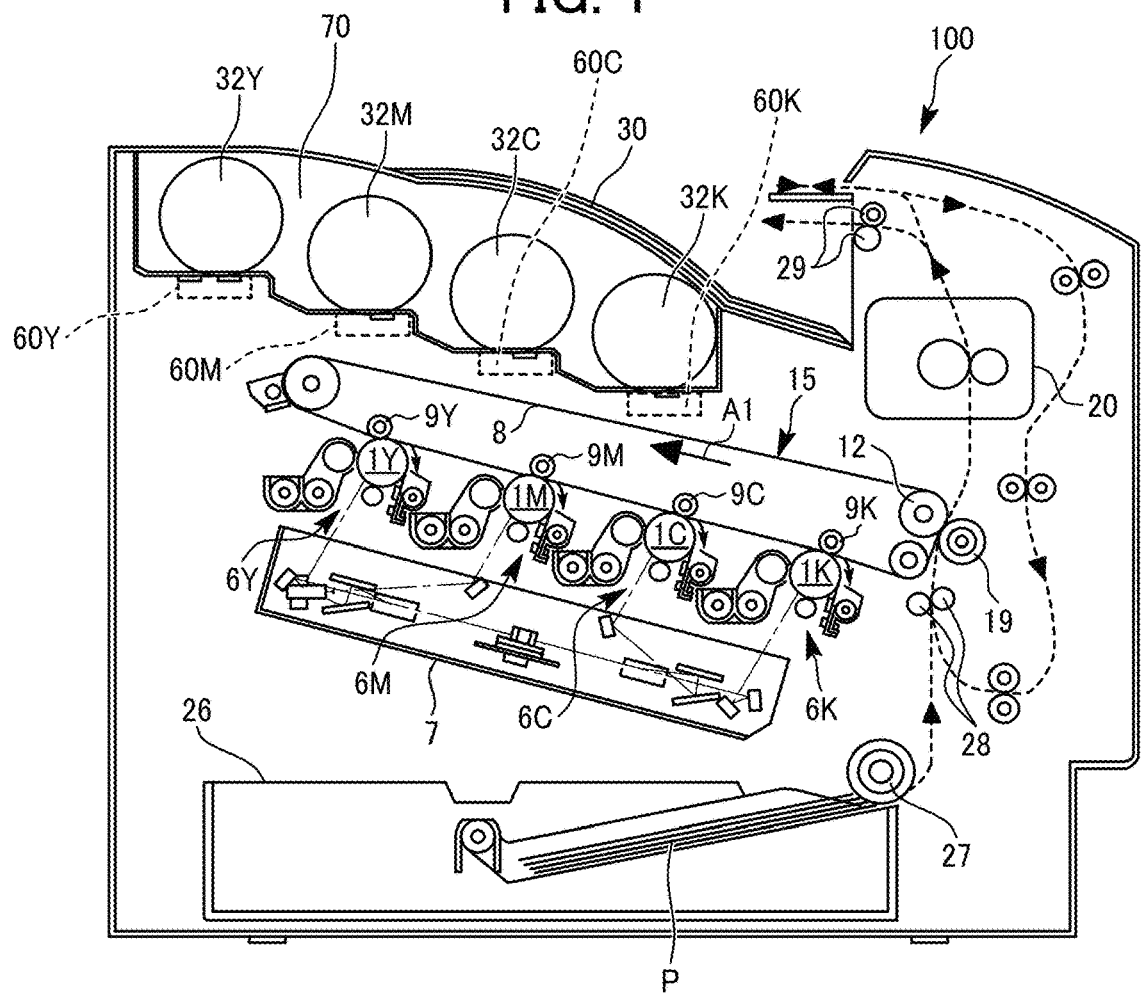
FIG. 1 is a schematic diagram illustrating an overall configuration of an image forming apparatus according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Hereinafter, embodiments of the present disclosure are described in detail with reference to the drawings. In the drawings, like reference signs denote like elements, and overlapping description may be simplified or omitted as appropriate.

First, an overall configuration and operation of an image forming apparatus 100 is described.

FIG. 1 is a schematic diagram illustrating an overall configuration of the image forming apparatus 100 according to the present embodiment.

Figure 3:
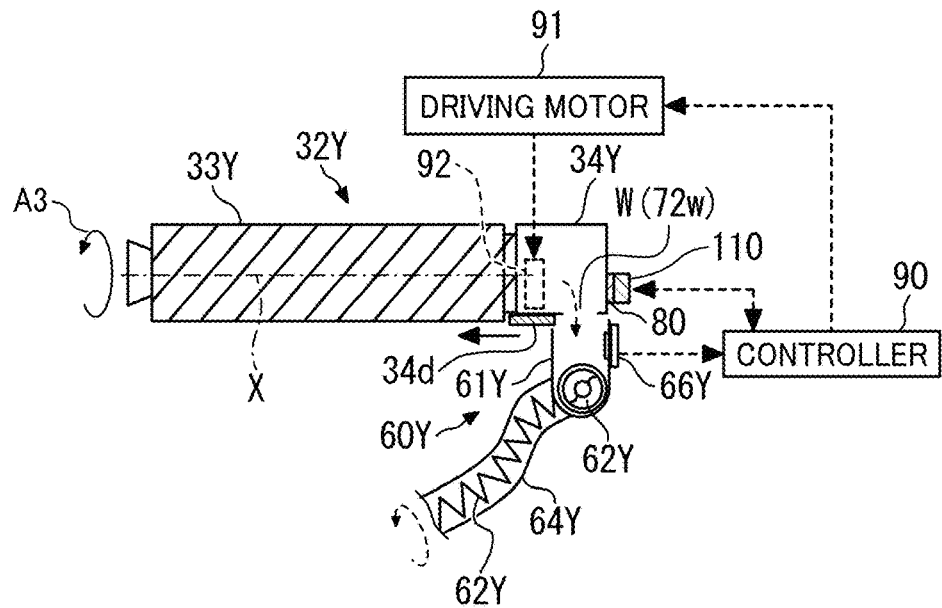
FIG. 3 is a schematic diagram illustrating a toner supply device to which a toner container is attached, according to an embodiment of the present disclosure.

FIG. 3 is a schematic diagram illustrating a toner supply device 60Y, 60M, 60C, 60K to which a toner container 32Y, 32M, 32C, 32K is attached.

As illustrated in FIGS. 1 and 3, toner containers 32Y, 32M, 32C, and 32K as four detachable units corresponding to the colors of yellow, magenta, cyan, and black, respectively are detachably and replaceably mounted on a toner container mount 70 in an upper portion of the image forming apparatus 100.

An intermediate transfer unit 15 is disposed below the toner container mount 70. Image forming devices 6Y, 6M, 6C, and 6K that correspond to toner images of yellow, magenta, cyan, and black, respectively, are arranged side by side, facing an intermediate transfer belt 8 of the intermediate transfer unit 15.

Toner supply devices 60Y, 60M, 60C, and 60K are provided below the toner containers 32Y, 32M, 32C, and 32K, respectively. Toner stored in the toner containers 32Y, 32M, 32C, and 32K is supplied into each corresponding one of developing units of the image forming devices 6Y, 6M, 6C, and 6K, respectively, by the toner supply devices 60Y, 60M, 60C, and 60K, respectively.

Figure 2:
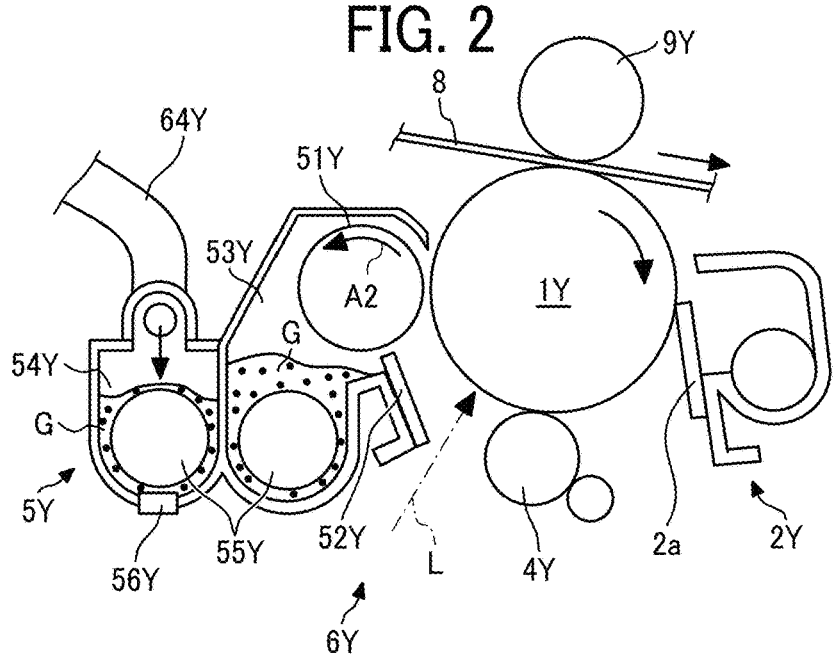
FIG. 2 is a schematic cross-sectional view of an image forming device of an image forming apparatus, according to an embodiment of the present disclosure.

FIG. 2 is a schematic cross-sectional view of the image forming device 6Y of the image forming apparatus 100, according to the present embodiment.

As illustrated in FIG. 2, the image forming device 6Y corresponding to yellow includes a photoconductor drum 1Y as an image bearer, a charger 4Y, a developing device 5Y, a cleaner 2Y, and a discharger. The charger 4Y, the developing device 5Y, the cleaner 2Y, and the discharger are provided around the photoconductor drum 1Y. An image forming process that includes a charging step, an exposure step, a developing step, a transfer step, a cleaning step, and a discharging step, is performed on the photoconductor drum 1Y. Thus, a yellow toner image is formed on the surface of the photoconductor drum 1Y.

The other three image forming devices 6M, 6C, and 6K have substantially the same configuration as that of the image forming device 6Y corresponding to yellow except that the colors of toners to be used are different, and images corresponding to the respective toner colors are formed. Thus, only the image forming device 6Y corresponding to yellow is described below and descriptions of the other three image forming devices 6M, 6C, and 6K are omitted where appropriate.

As illustrated in FIG. 2, the photoconductor drum 1Y is driven to rotate clockwise in FIG. 2 by a motor. The charger 4Y uniformly charges the surface of the photoconductor drum 1Y as the charging step.

When the surface of the photoconductor drum 1Y reaches a position at which the surface of the photoconductor drum 1Y is irradiated with a laser beam L emitted from an exposure device 7 (see FIG. 1), the photoconductor drum 1Y is scanned with the laser beam L. Thus, an electrostatic latent image for yellow is formed on the photoconductor drum 1Y as the exposure step.

Then, the surface of the photoconductor drum 1Y reaches a position opposite the developing device 5Y, at which the electrostatic latent image is developed into a yellow toner image as the development step.

When the surface of the photoconductor drum 1Y carrying the yellow toner image reaches a position opposite a primary transfer roller 9Y via the intermediate transfer belt 8, the yellow toner image Y on the photoconductor drum 1Y is transferred onto the intermediate transfer belt 8 as the primary transfer step. After the primary transfer step, a certain amount of untransferred toner remains on the photoconductor drum 1Y.

When the surface of the photoconductor drum 1Y reaches a position opposite the cleaner 2Y, a cleaning blade 2a of the cleaner 2Y mechanically collects the untransferred toner on the photoconductor drum 1Y as the cleaning step.

Finally, the surface of the photoconductor drum 1Y reaches a position opposite a discharger, and the discharger removes residual potentials from the photoconductor drum 1Y to complete a sequence of the image forming process performed on the photoconductor drum 1Y.

The image forming process described above is also performed in the other image forming devices 6M, 6C, and 6K in a similar manner to the image forming device 6Y for yellow. In other words, the exposure device 7 disposed below the image forming devices 6M, 6C, and 6K irradiates photoconductor drums 1M, 1C, and 1K of the image forming devices 6M, 6C, and 6K, respectively, with the laser beams L based on image data.

Then, toner images formed on the photoconductor drums 1Y, 1M, 1C, and 1K through the development step are transferred and superimposed onto the intermediate transfer belt 8. Thus, a color toner image is formed on the intermediate transfer belt 8.

In the present embodiment, as illustrated in FIG. 1, the intermediate transfer unit 15 includes, for example, the intermediate transfer belt 8, four primary transfer rollers 9Y, 9M, 9C, and 9K, a secondary-transfer backup roller 12, a plurality of tension rollers, and an intermediate transfer cleaner. The intermediate transfer belt 8 is stretched around and supported by the multiple rollers and is rotated by one of the multiple rollers, i.e., the secondary-transfer backup roller 12, that serves as a drive roller rotates in a direction indicated by arrow A1 illustrated in FIG. 1.

The four primary transfer rollers 9Y, 9M, 9C, and 9K are pressed against the photoconductor drums 1Y, 1M, 1C, and 1K, respectively, via the intermediate transfer belt 8 to form primary transfer nips. A primary-transfer bias opposite in polarity to toner is applied to the primary transfer rollers 9Y, 9M, 9C, and 9K.

While rotating in the direction indicated by arrow A1 in FIG. 1, the intermediate transfer belt 8 passes through the primary transfer nips between the photoconductor drums 1Y, 1M, 1C, and 1K and the respective four primary transfer rollers 9Y, 9M, 9C, and 9K. As a result, multicolor toner images on the photoconductor drums 1Y, 1M, 1C, and 1K are superimposed on top of one another and are primarily transferred to the intermediate transfer belt 8.

Subsequently, the intermediate transfer belt 8 to which the superimposed toner images of yellow, cyan, magenta, and black have been transferred reaches a position opposite the secondary transfer roller 19. At this position, the secondary-transfer backup roller 12 and the secondary transfer roller 19 press against each other via the intermediate transfer belt 8 to form a secondary transfer nip. The toner images of yellow, cyan, magenta, and black formed on the intermediate transfer belt 8 are transferred onto a sheet P such as a sheet of paper conveyed to the secondary transfer nip. At this time, untransferred toner that has not been transferred onto the sheet P remains on the surface of the intermediate transfer belt 8.

The surface of the intermediate transfer belt 8 then reaches a position opposite the intermediate transfer cleaner, and the untransferred toner is collected from the intermediate transfer belt 8 at the position to complete a series of the image transfer process performed on the intermediate transfer belt 8.

In the present embodiment, the sheet P that is conveyed to the position of the secondary transfer nip is conveyed from a sheet feeder 26 disposed in a lower portion of a body of the image forming apparatus 100 via a sheet feeding roller 27, a registration roller pair 28, and the like.

Specifically, the sheet feeder 26 contains a stack of multiple sheets P such as sheets of paper stacked on another. The sheet feeding roller 27 rotates counterclockwise in FIG. 1 to feed a top sheet P from the stacked sheets P toward a roller nip between the registration roller pair 28.

As the registration roller pair 28 stops rotating temporarily, the leading end of the sheet P stops moving at the roller nip of the registration roller pair 28. Then, the registration roller pair 28 rotates to transport the sheet P toward the secondary transfer nip in synchronization with the arrival of the color toner image on the intermediate transfer belt 8. Thus, a desired color image is transferred onto the sheet P.

Subsequently, the sheet P, onto which the multicolor image has been transferred at the secondary transfer nip, is conveyed to a fixing device 20. At this position, the color image transferred onto the front surface of the sheet P is fixed onto the sheet P by heat and pressure from a fixing roller and a pressure roller.

Subsequently, the sheet P passes through between an output roller pair 29 and is ejected to the outside of the image forming apparatus 100. The sheets P ejected by the output roller pair 29 are sequentially stacked as output documents on a stacking tray 30.

Thus, a sequence of image forming processes performed in the image forming apparatus 100 is completed.

Next, the configuration and operation of the developing device in the image forming devices 6Y, 6M, 6C, and 6K is described in more detail with reference to FIG. 2.

The developing device 5Y includes, for example, a developing roller 51Y disposed opposite the photoconductor drum 1Y, a doctor blade 52Y disposed opposite the developing roller 51Y, two conveying screws 55Y disposed in developer containers 53Y and 54Y, and a toner concentration sensor 56Y to detect concentration of toner in developer G. The developing roller 51Y includes, for example, stationary magnets therein, a sleeve that rotates around the magnets. The developer containers 53Y and 54Y contain the two-component developer G including carrier and toner. The developer container 54Y communicates with a toner conveyance pipe 64Y as a toner conveyance path via an opening formed above the developer container 54Y.

The developing device 5Y as described above operates as follows. The sleeve of the developing roller 51Y rotates in a direction indicated by arrow A2 in FIG. 2. The developer G is carried on the developing roller 51Y by a magnetic field generated by the magnets. As the sleeve rotates, the developer G moves along the circumference of the developing roller 51Y.

Figure 5:
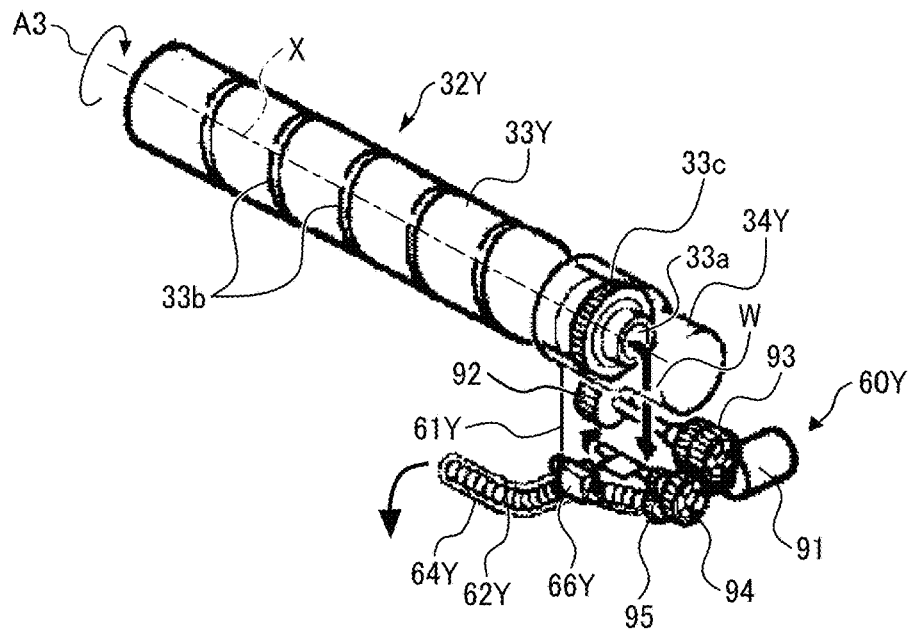
FIG. 5 is a perspective view of a toner container and a relevant part of a toner supply device according to an embodiment of the present disclosure.

FIG. 5 is a perspective view of relevant parts of a toner supply device 60Y and a toner container 32Y according to the present embodiment.

In the present embodiment, the percentage or concentration of toner in the developer G, i.e., the ratio of toner to carrier in the developing device 5Y is constantly adjusted within a predetermined range. More specifically, as toner in the developing device 5Y is consumed, toner as the developer stored in the toner container 32Y is supplied to the toner supply device 60Y (see, for example, FIGS. 3 and 5) via the developer container 54Y. The configuration and operation of the toner supply device 60Y will be described later in detail.

The two conveying screws 55Y stir and mix the developer G with toner supplied to the developer container 54Y while circulating the developer G in the developer containers 53Y and 54Y. In this case, the developer G moves in the direction perpendicular to the surface of the paper on which FIG. 2 is drawn. The toner in developer G is triboelectrically charged by friction with the carrier and electrostatically attracted to the carrier. Then, toner is carried on the developing roller 51Y together with the carrier by magnetic force generated on the developing roller 51Y.

The developer G carried on the developing roller 51Y is conveyed in the direction indicated by arrow A2 illustrated in FIG. 2 to the doctor blade 52Y. The amount of developer G on the developing roller 51Y is adjusted at the position of the doctor blade 52Y. Then, the developer G is conveyed to a development range opposite the photoconductor drum 1Y. The toner in the developer G is attracted to the latent image formed on the photoconductor drum 1Y due to the effect of an electric field generated in the development range. As the sleeve rotates, the developer G remaining on the developing roller 51Y reaches an upper part of the developer container 53Y and separates from the developing roller 51Y at the position.

Next, the toner supply devices 60Y, 60M, 60C, and 60K are described in detail with reference to, for example, FIGS. 3, 4, and 5.

As illustrated in, for example, FIG. 3, toner as the developer is stored in each of the toner containers 32Y, 32M, 32C, and 32K mounted on the toner container mount 70 in the image forming apparatus 100. Then, toner is supplied to each of the developing devices 5Y, 5M, 5C, and 5K by one of the toner supply devices 60Y, 60M, 60C, and 60K of the corresponding toner color, in accordance with toner consumption in the developing device of each color.

The four toner supply devices 60Y, 60M, 60C, and 60K or the toner containers 32Y, 32M, 32C, and 32K have substantially the same structure except that the colors of the toners used in the image forming process are different. Thus, only the toner supply device 60Y and the toner container 32Y for yellow are described, and the description of the toner supply devices 60M, 60C, and 60K corresponding to the other three colors, and the toner containers 32M, 32C, and 32K corresponding to the other three colors is omitted as appropriate.

Figure 4:
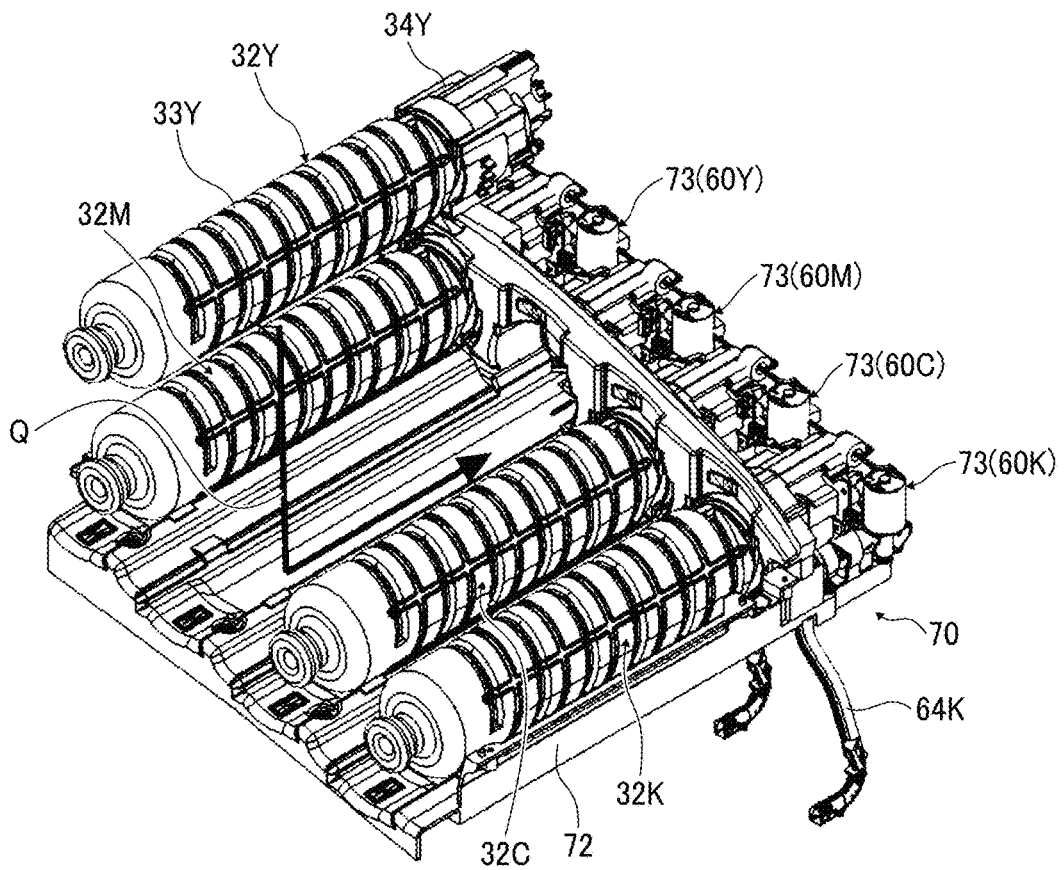
FIG. 4 is a perspective view of toner containers mounted on a toner container mount, according to an embodiment of the present disclosure.

FIG. 4 is a perspective view of the toner containers 32Y, 32M, 32C, and 32K mounted on the toner container mount 70, according to the present embodiment.

As illustrated in FIG. 4, when the toner containers 32Y, 32M, 32C, and 32K are moved along arrow Q to be inserted into the toner container mount 70 in the image forming apparatus 100, shutters 34d (see FIG. 3) of the toner containers 32Y, 32M, 32C, and 32K move in conjunction with the mounting operation of the toner containers 32Y, 32M, 32C, and 32K to open toner discharge ports W of the toner supply devices 60Y, 60M, 60C, and 60K of the toner container mount 70 and the toner supply ports 72W (see FIG. 3) are communicated with each other. Accordingly, toner contained in the toner containers 32Y, 32M, 32C, and 32K is discharged from the toner discharge ports W, and is stored in a toner tank 61Y via the toner supply ports 72W of the toner supply devices 60Y, 60M, 60C, and 60K of the toner container mount 70.

Figure 6:
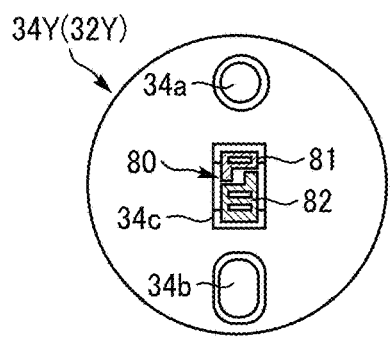
FIG. 6 is a front view of a cap of a toner container, according to an embodiment of the present disclosure.

FIG. 6 is a front view of the cap 34Y of the toner containers 32Y, according to the present embodiment.

Figure 7:
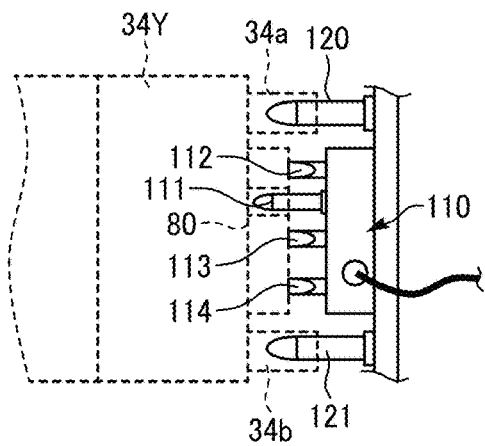
FIG. 7 is a view of a plurality of terminals provided for a body of an image forming apparatus, according to an embodiment of the present disclosure.

FIG. 7 is a view of a plurality of terminals 111, 112, 113, and 114 provided for the body of the image forming apparatus 100, according to the present embodiment.

As illustrated in, for example, FIGS. 3 and 6, when the toner container 32Y is mounted into the image forming apparatus 100, the circuit board unit 80 installed on the cap 34Y of the toner container 32Y is connected to a terminal unit 110 (see FIG. 7) of the image forming apparatus 100 in conjunction with the mounting operation of the toner container 32Y. Thus, information can be exchanged between the circuit boards 81 and 82 as IC chips, of the circuit board unit 80 and the controller 90 of the image forming apparatus 100. Then, based on the information acquired from the circuit boards 81 and 82, the controller 90 displays the amount of toner remaining in the toner container 32Y on an operation display panel, which is mounted on the exterior of the body of the image forming apparatus 100, determines the timing of toner replenishment from the toner container 32Y to the developing device 5Y, and executes a recovery operation from toner end state.

In the present embodiment, as illustrated in, for example, FIGS. 3 and 5, the toner container 32Y as the detachable unit such as the toner containers 32Y, 32M, 32C, and 32K is a substantially cylindrical toner bottle. The toner container 32Y typically includes the cap 34Y held by the toner container mount 70 in a non-rotatable manner and a toner bottle 33Y integrally formed with a gear 33c.

The toner bottle 33Y is held so as to be rotatable relative to the cap 34Y and rotationally driven in the direction indicated by arrow A3 in FIGS. 3 and 5 by a drive mechanism which includes, for example, a driving motor 91, gears 92 and 93. The toner bottle 33Y itself is rotated about an axial line X such that toner contained in the toner bottle 33Y of the toner container 32Y is conveyed by projections 33b (see FIG. 5) formed in a spiral shape on an inside wall surface (inner peripheral surface) of the toner bottle 33Y in an axial direction, i.e., a longitudinal direction (from left to right in FIG. 3). Accordingly, toner is discharged from an opening 33a of the toner bottle 33Y to the cap 34Y and further discharged from the toner discharge port W of the cap 34Y outside of the toner container 32Y. In other words, as the toner bottle 33Y of the toner container 32Y is driven to rotate by the driving motor 91 when necessary. Toner is supplied to the toner tank 61Y accordingly. Each of the toner containers 32Y, 32M, 32C, and 32K is replaced with a new one when each of the toner containers 32Y, 32M, 32C, and 32K reaches the end of the operational life, i.e., when almost all of toner contained in the toner containers 32Y, 32M, 32C, or 32K is consumed and the corresponding toner container is empty.

Figure 8:
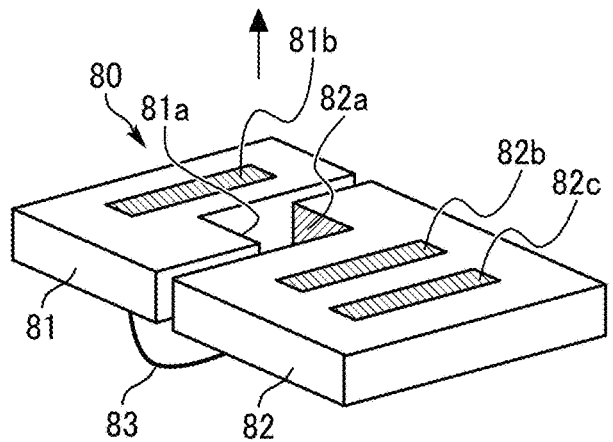
FIG. 8 is a perspective view of a circuit board unit according to an embodiment of the present disclosure.

FIG. 8 is a perspective view of the circuit board unit 80 according to the present embodiment.

As illustrated, in, for example, FIG. 6, the circuit board unit 80 is fitted to and installed on an installation portion 34C formed on an end-face of the cap 34Y. The circuit boards 81 and 82 (see FIG. 8) as data storage devices are installed on the circuit board unit 80.

The circuit boards 81 and 82 are, for example, IC chips and exchange various kinds of data with the controller 90 of the image forming apparatus 100. More specifically, the circuit boards 81 and 82 store in advance information such as the manufacturing date, the production lot number, the color, and the type of the toner bottle 33Y contained in the toner container 32Y and information such as the manufacturing date, the destination, the manufacturing factory, and the recyclability of the toner container 32Y itself. The above-described pieces of information are sent to the controller 90 of the image forming apparatus 100. Further, information such as a use history in the image forming apparatus 100 is also transmitted from the controller 90 provided for the image forming apparatus 100 to the circuit boards 81 and 82 as the IC chips. Thus, the information is stored in the circuit boards 81 and 82 where appropriate.

The circuit board unit 80 in the present embodiment does not includes one circuit board installed in the circuit board unit 80. However, the two circuit boards 81 and 82 are separately installed in the circuit board unit 80. The configuration and operation of the circuit board unit 80 will be described in more detail later.

As illustrated in FIG. 6, positioning holes 34a and 34b are formed on the end face of the cap 34Y to determine the position of the cap 34Y in the toner container mount 70 of the image forming apparatus 100.

When the toner container 32Y is mounted on the body of the image forming apparatus 100, the positioning holes 34a and 34b formed on the cap 34Y of the toner container 32Y are fitted to positioning pins 120 and 121 (see FIG. 7) projecting from the body of the image forming apparatus 100 in conjunction with the mounting operation of the toner container 32Y. Accordingly, the position of the cap 34Y in the toner container mount 70 and in the body of the image forming apparatus 100 is determined. Then, the circuit board unit 80 is normally connected to the terminal unit 110 (see FIG. 7) of the image forming apparatus 100 via the cap 34Y positioned as described above.

As illustrated in FIGS. 3 and 5, each of the toner supply devices 60Y, 60M, 60C, and 60K includes, for example, the toner container mount 70, the toner tank 61Y, a conveying coil 62Y, a toner end sensor 66Y, a driving motor 91, and gears 92, 93, 94, and 95.

The toner tank 61Y is disposed below the toner discharge port W of the toner container 32Y, and stores toner discharged from toner discharge port W of the toner container 32Y. A bottom portion of the toner tank 61Y is connected to an upstream portion of the toner conveyance pipe 64Y.

The toner end sensor 66Y is disposed on a side wall of the toner tank 61Y at a predetermined height from the bottom of the side wall and detects that the amount of toner stored in the toner tank 61Y has fallen to equal to or less than a predetermined amount. For example, a piezoelectric sensor can be used as the toner end sensor 66Y. Then, when the controller 90 detects that the amount of toner stored in the toner tank 61Y is equal to or less than the predetermined amount by the toner end sensor 66Y as a toner end detection, the controller 90 controls the driving motor 91 to rotationally drive the toner bottle 33Y of the toner container 32Y for a predetermined time to supply toner to the toner tank 61Y. Further, in a case in which the toner end detection by the toner end sensor 66Y is not released even if such control is repeated, it is determined that there is no toner in the toner container 32Y, and a message for prompting replacement of the toner container 32Y is displayed on the operation display panel installed on an exterior portion of the image forming apparatus 100.

As illustrated in FIGS. 3 and 5, the conveying coil 62Y is provided inside the toner conveyance pipe 64Y so as to rotate, and conveys toner stored in the toner tank 61Y toward the developing device 5Y via the toner conveyance pipe 64Y. More specifically, the conveying coil 62Y is rotationally driven by the driving motor 91 to convey toner from the bottom portion, which is a lowermost portion, of the toner tank 61Y toward an upper portion of the developing device 5Y along the toner conveyance pipe 64Y. Then, toner conveyed by the conveying coil 62Y is supplied into the developer container 54Y of the developing device 5Y.

In the present embodiment, the driving source of the conveying coil 62Y is commonly shared as the driving source of the toner bottle 33Y and of the toner container 32Y. In other words, when the driving motor 91 is rotationally driven, the toner container 32Y rotates and the conveying coil 62Y also rotates.

As illustrated in FIG. 4, the toner container mount 70 typically includes a cap holder 73 for holding the cap 34Y of the toner container 32Y, a bottle holder 72 for holding the toner bottle 33Y of the toner container 32Y, and the terminal unit 110 (see FIGS. 3 and 7). The terminal unit 110 includes a plurality of terminals 111, 112, 113, and 114.

In the present embodiment, as illustrated in FIG. 1, when a body cover disposed above a front side of the image forming apparatus 100, which is the front side in the direction perpendicular to the sheet surface of FIG. 1, is opened, the toner container mount 70 is exposed. In a state in which the axial directions, i.e., longitudinal directions of the toner containers 32Y, 32M, 32C, and 32K, are horizontal, the operation to mount and detach the toner containers 32Y, 32M, 32C, and 32K on and from the image forming apparatus 100 from above the front side of the image forming apparatus 100 is performed, which is an attachment and detachment operation of the toner containers 32Y, 32M, 32C, and 32K in the longitudinal directions of toner containers 32Y, 32M, 32C, and 32K.

More specifically, when the toner containers 32Y, 32M, 32C, and 32K are mounted on the body of the image forming apparatus 100, the toner containers 32Y, 32M, 32C, and 32K are placed on the toner container mount 70 from above the body of the image forming apparatus 100 with the body cover opened. Then, each of the toner containers 32Y, 32M, 32C, and 32K is pushed horizontally and moved along arrow Q in FIG. 4 with the corresponding one of the caps 34Y at the top. By contrast, when the toner containers 32Y, 32M, 32C, and 32K are detached from the body of the image forming apparatus 100, the operations are performed in reverse to the operations when the toner containers 32Y, 32M, 32C, and 32K are mounted.

Hereinafter, the configuration and operation of the circuit board unit 80 installed in the toner container 32Y as the detachable unit according to the present embodiment are described.

Figure 9A:
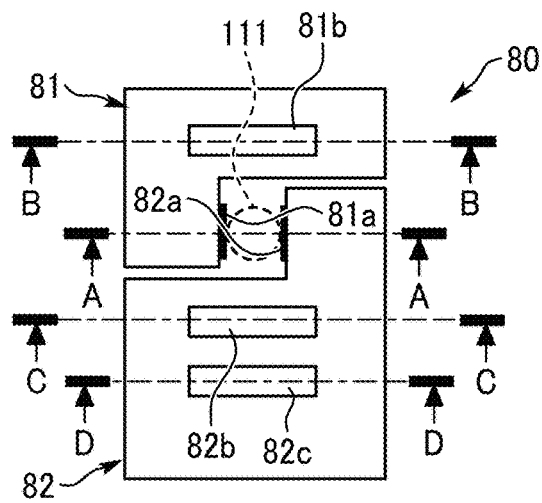
FIG. 9A is a top view of a circuit board unit according to an embodiment of the present disclosure.

FIG. 9A is a top view of the circuit board unit 80 according to the present embodiment.

Figure 9B:
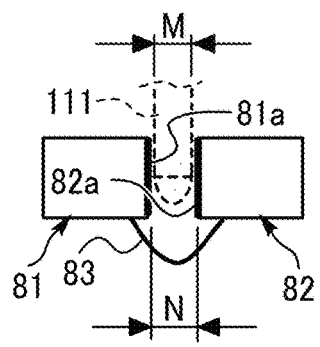
FIG. 9B is an A-A cross-sectional view of the circuit board unit of FIG. 9A, according to an embodiment of the present disclosure.

FIG. 9B is an A-A cross-sectional view of the circuit board unit 80 of FIG. 9A, according to the present embodiment.

Figure 9C:
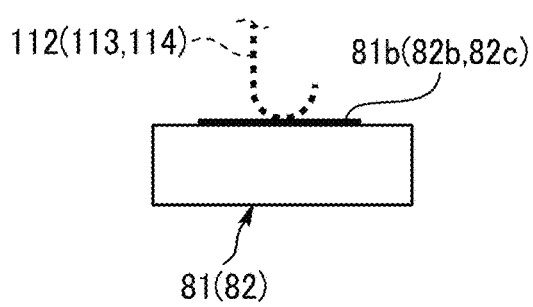
FIG. 9C is a B-B sectional view, a C-C sectional view, or a D-D sectional view of the circuit board unit of FIG. 9A, according to an embodiment of the present disclosure.

FIG. 9C is a B-B cross-sectional view, a C-C cross-sectional view, or a D-D cross-sectional view of the circuit board unit 80 of FIG. 9A, according to the present embodiment.

As described above with reference to, for example, FIGS. 3, 6, and 7, the toner container 32Y in which toner is stored serves as the detachable unit that is detachably installed in the body of the image forming apparatus 100. The circuit board unit 80 on which the circuit boards 81 and 82 as two individual circuit boards, which are IC-chips in the present embodiment, are installed, is mounted on the cap 34Y of the toner containers 32Y as the detachable unit. Thus, the circuit board unit 80 can communicate with the controller 90 of the image forming apparatus 100.

The circuit board unit 80 is detachably installed in a predetermined direction, i.e., the left-right direction in FIG. 3 and the direction perpendicular to the paper surface of FIG. 9A with respect to the image forming apparatus 100.

An arrow illustrated in FIG. 8 indicates the mounting direction of the circuit board unit 80 including the toner container 32Y.

As illustrated in FIGS. 8, 9A, 9B and 9C, the circuit board unit 80 typically includes, for example, a plurality of circuit boards, i.e., the first circuit board 81 and the second circuit board 82, and a conducting wire 83 that serves as a relay.

The multiple circuit boards 81 and 82 are arranged side by side with a space therebetween in a direction substantially perpendicular to a detachable and detachment direction to and from the circuit board unit 80 provided for the toner container 32Y with respect to the image forming apparatus 100. Such a detachable and detachment direction corresponds to a predetermined direction, and such a direction approximately perpendicular to the detachable and detachment direction corresponds to the vertical direction in FIG. 9A. In other words, the multiple circuit boards 81 and 82 are arranged side by side with a gap therebetween so as to be substantially perpendicular to the detachable and detachment direction of the circuit board unit 80 described above.

The multiple circuit boards 81 and 82, which are the two circuit boards 81 and 82 in the present embodiment, are IC chips in which an information storage unit capable of communicating information with the image forming apparatus 100 is installed on at least one of the circuit boards 81 and 82 (for example, the first circuit board 81). The IC chip that can be operated as one IC chip is divided into two IC chips.

The conducting wire 83 as the relays enable the two circuit boards 81 and 82 to electrically communicate with each other so that the circuit boards 81 and 82 divided as two individual circuit boards function as one IC chip. Accordingly, the conducting wire 83 is electrically connected to the electronic circuit of each of the two circuit boards 81 and 82.

In the present embodiment, as illustrated in FIGS. 8, 9A, and 9B, the multiple circuit boards 81 and 82 include grounding terminals 81a and 82a, respectively. The grounding terminals 81a and 82a are provided on end-faces facing each of the adjacent circuit boards 81 and 82, i.e., on side surfaces extending in the detachable and detachment direction of the circuit board unit 80 as the predetermined direction. The grounding terminals 81a and 82a, as end-face terminals, are detachable from a grounding terminal 111 provided for the body of the image forming apparatus 100.

The grounding terminal 111 has a rod-shape (shaft-shape). The grounding terminal 111 is inserted between the adjacent circuit boards 81 and 82 in conjunction with the mounting operation of the circuit board unit 80 including the toner container 32Y on the body of the image forming apparatus 100. In the present embodiment, the grounding terminal 111 is grounded in the body of the image forming apparatus 100 and grounds the base portions of the circuit boards 81 and 82 via the grounding terminals 81a and 82a, respectively.

More specifically, as illustrated in FIG. 9A, when viewed in the detachable and detachment direction of the circuit board unit 80 as the predetermined direction, the first circuit board 81 is formed in a substantially L-shape, and the second circuit board 82 is formed in a substantially inverted L-shape. The two circuit boards 81 and 82 are arranged to face each other with a clearance therebetween such that the overall outer shape of the circuit board unit 80, which is the outer shape of the circuit board unit 80 when the circuit board unit 80 is viewed in the detachable and detachment direction of the circuit board unit 80 as the predetermined direction, is substantially rectangular.

The first circuit board 81 includes the plate-shaped grounding terminal 81a on a right end face of the portion of the first circuit board 81, projecting downward in FIG. 9A. On the other hand, the second circuit board 82 includes the plate-shaped grounding terminal 82a on a left end face of the portion of the second circuit board 82, projecting upward in FIG. 9A. The direction in which the two grounding terminals 81a and 82a face each other substantially coincides with a longitudinal direction in which substantially rectangular main surface terminals, i.e., a clock-signal terminal 81b, a serial-data terminal 82b, and a power-supply terminal 82c to be described later, are arranged. The longitudinal direction is a horizontal direction in FIG. 9A.

The grounding terminal 11l is inserted between the two grounding terminals 81a and 82a in conjunction with the mounting operation of the toner container 32Y including the circuit board unit 80 on the image forming apparatus 100 via the terminal unit 110. In other words, the outer peripheral surface of the rod-shaped grounding terminal 111 comes into line contact with the plate-shaped grounding terminals 81a and 82a. Accordingly, the two grounding terminals 81a and 82a are electrically connected to the grounding terminal 111, and the circuit board unit 80 including the first and second circuit boards 81 and 82 can be grounded.

The plate-shaped grounding terminals 81a and 82a can also be formed in a curved surface shape in accordance with the shape of the outer peripheral surface of the grounding terminal 111 so that the outer peripheral surface of the rod-shaped grounding terminal 111 face-contacts the plate-shaped grounding terminals 81a and 82a.

As illustrated in FIGS. 8, 9A, and 9C, at least one of multiple circuit boards 81 and 82 (two circuit boards 81 and 82 in the present embodiment) includes substantially rectangular main surface terminals 81b, 82b, and 82c. The main surface terminals 81b, 82b, and 82c, which are attachable to and detachable from second terminals 112, 113, and 114 provided for the body of the image forming apparatus 100, respectively, are provided on surfaces of the circuit boards 81 and 82, which face the terminal unit 110, substantially perpendicular to the detachable and detachment direction of the circuit board unit 80 as the predetermined direction.

In the present embodiment, the secondary grounding terminal according to the present embodiment is a plate-shaped terminal that contacts the main-surface terminals 81b, 82b, and 82c across their entire surface, and includes a body clock-signal terminal 112, a body serial-signal terminal 113, and a body power supply terminal 114 provided for the body of the image forming apparatus 100. A clock-signal terminal 81b, a serial-data terminal 82b, and a power-supply terminal 82c are the main-surface terminals. The clock signal terminal 81b is provided on the first circuit board 81. The serial-data terminal 82b and the power-supply terminal 82c are provided on the second circuit board 82.

The clock-signal terminal 81b is connected to the body clock-signal terminal 112 and receives a clock signal for aligning transmission and reception timings in the circuit board 81. The serial-data terminal 82b is connected to the body serial-data terminal 113 to perform serial-data communication with the image forming apparatus 100. The power supply terminal 82c is connected to the body power supply terminal 114 and is a terminal for supplying power from the image forming apparatus 100 to operate the circuit board 81. The surfaces of the two circuit boards 81 and 82 are covered with an insulating material, i.e., non-conductive material except for a portion on which the above-described terminals (81a, 81b, 82a, 82b, 82c) are exposed and a portion at which the conducting wire 83 is connected.

Figure 10A:
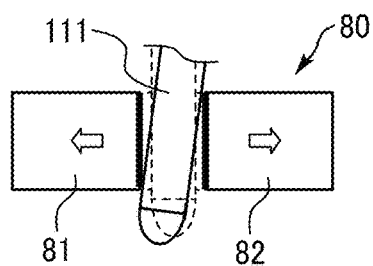
FIGS. 10A and 10B are enlarged views of a terminal in which the terminal is inserted obliquely into a grounding terminal of a circuit board relative to the circuit board, according to an embodiment of the present disclosure.
Figure 10B:
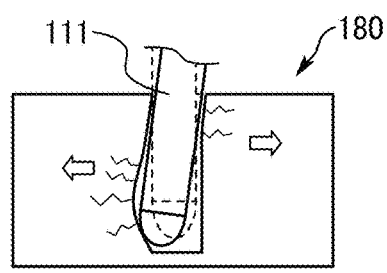

FIGS. 10A and 10B are enlarged views of the grounding terminal 11 in which the grounding terminal 111 is inserted obliquely relative to the grounding terminals of the circuit board 81 and 82.

As described above, in the circuit board unit 80 according to the present embodiment, the rod-shaped grounding terminal is not connected and fitted to the hole-shaped grounding terminal formed in each one of the circuit boards 81 and 82. However, the grounding terminal 111 as the terminal provided for the body of the image forming apparatus 100 is connected so as to be sandwiched between the grounding terminals 81a and 82a provided on the end-faces of the two divided circuit boards 81 and 82, respectively.

Accordingly, as compared with the case in which the rod-shaped grounding terminal 111 is fitted into the hole-shaped grounding terminal formed in one of the circuit boards 81 and 82 (see FIG. 10B), the circuit boards 81 and 82 are less likely to be damaged when the toner container 32Y including the circuit board unit 80 is mounted on the body of the image forming apparatus 100. In particular, even when the toner container 32Y is not mounted straight on the body of the image forming apparatus 100 and the grounding terminal 111 is inserted into the circuit board unit 80 in an inclined state relative to the circuit board unit 80 as illustrated in FIG. 10A, and the circuit boards 81 and 82 receive forces from the grounding terminal 111 via the grounding terminals 81a and 82a in directions indicated by arrows in white, the two divided circuit boards 81 and 82 are not coupled to each other and are movable along the directions in which the forces act. Thus, the circuit boards 81 and 82 are not likely to be broken.

On the other hand, as in the case of the circuit board 180 illustrated as a comparative example in FIG. 10B, when the rod-shaped grounding terminal 111 is fitted in an inclined state to the hole-shaped grounding terminal formed in one of the circuit boards 81 and 82, the circuit board 180 is damaged by receiving forces in directions indicated by arrows in white from the grounding terminal 111 via the grounding terminal.

In the present embodiment, as illustrated in FIG. 9B, a distance N is slightly shorter than a length M. The distance N is a distance between the grounding terminal 81a and the grounding terminal 82a in a direction in which the grounding terminal 81a as the end-face terminal and the grounding terminal 82a as the other end-face terminal provided on the circuit boards 81 and 82 adjacent to each other face each other. The distance M is a distance represented by the diameter of the grounding terminal 111. (Distance N is shorter than distance M).

Such a configuration described above allows the grounding terminal 111 to contact the grounding terminals 81a and 82a reliably. Thus, conduction failure (grounding failure) is less likely to occur. In this case, when the grounding terminal 111 is inserted into the circuit board unit 80, the two circuit boards 81 and 82 receive forces in directions away from each other from the grounding terminal 111 via the grounding terminals 81a and 82a. However, the two divided circuit boards 81 and 82 are not coupled to each other and are movable along the directions in which the forces act. Thus, the circuit boards 81 and 82 are not likely to be broken.

In the present embodiment, preferably, a space in which the two circuit boards 81 and 82 can move in the installation portion 34C (see FIG. 6) of the toner container 32Y that holds the circuit board unit 80 on the cap 34Y, and also a guide portion that guides the movement of the two circuit boards 81 and 82 are formed to facilitate the two circuit boards 81 and 82 to move in the left-right direction of FIG. 9A.

In such a case, preferably, a biasing member such as a spring that biases the two circuit boards 81 and 82 toward each other is provided. Further, in such a case, preferably, a stopper that limits the two circuit boards 81 and 82 so as not to approach each other without limitation by the biasing member is provided such that the stopper can contact the circuit boards 81 and 82.

Here, as illustrated, for example, in FIG. 9B, in the circuit board unit 80 according to the present embodiment, the conducting wire 83 as a relay that enables electrical communication between the adjacent circuit boards 81 and 82 is provided separately from the grounding terminals 81a and 82a as the end-face terminals.

The conducting wire 83 is connected to the adjacent circuit boards 81 and 82. Specifically, one end of the conducting wire 83 is conductively connected to the electronic circuit of the first circuit board 81, and the other end of the conducting wire 83 is conductively connected to the electronic circuit of the second circuit board 82. Further, the conducting wire 83 is set to have a sufficient length so as not to prevent insertion of the grounding terminal 111 into the circuit board unit 80 and to prevent the first and second circuit boards 81 and 82 from being broken even when the first and second circuit boards 81 and 82 are separated in the left-right direction of FIG. 9B.

Providing the conducting wire 83 as described above allows the circuit boards 81 and 82 to function as one circuit board as an IC chip without providing an overlapping component (for example, an information storage unit) on the two circuit boards 81 and 82, even if a circuit board which originally functions as one circuit board as the IC chip is divided into two circuit boards 81 and 82.

First Modification

Figure 11:
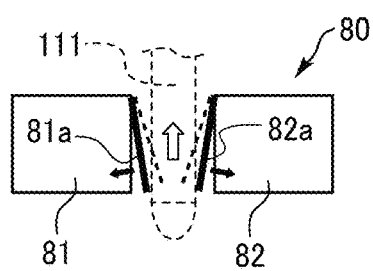
FIG. 11 is a cross-sectional view of a part of a circuit board unit according to a first modification of the above embodiments of the present disclosure.

FIG. 11 is a cross-sectional view of a part of the circuit board unit 80 according to a first modification of the above embodiments of the present disclosure and corresponds to FIG. 9B in the present embodiment.

As illustrated in FIG. 11, in the first modification, the grounding terminals 81a and 82a as the end-face terminals (81a and 82a) are formed so as to guide the grounding terminal 111 in conjunction with the mounting operation of the circuit board unit 80 in a direction indicated by arrow in white with respect to the image forming apparatus 100 and to be elastically deformed in the direction indicated by arrow in black when the grounding terminals 81a and 82a contact the grounding terminal 111.

Such a configuration described above allows the grounding terminal 111 to be smoothly inserted between the two grounding terminals 81a and 82a when the circuit board unit 80 is mounted and prevents the grounding terminal 111 from being brought into close contact with the grounding terminals 81a and 82a with relatively strong force. Thus, conduction failure (grounding failure) can be prevented.

Second Modification

Figure 12:
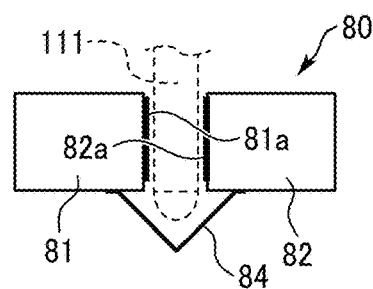
FIG. 12 is a cross-sectional view of a part of a circuit board unit according to a second modification of the above embodiments of the present disclosure.

FIG. 12 is a cross-sectional view of a part of the circuit board unit 80 according to a second modification of the above embodiments of the present disclosure, and corresponds to FIG. 9B in the present embodiment.

As illustrated in FIG. 12, in the second modification, a plate spring 84 formed in a substantially V shape is used as a relay instead of the conducting wire 83 to enable electrical communication between the adjacent circuit boards 81 and 82. The plate spring 84 is connected to the circuit boards 81 and 82 adjacent to each other.

Specifically, one end of the plate spring 84 is conductively connected to the electronic circuit of the first circuit board 81, and the other end of the plate spring 84 is conductively connected to the electronic circuit of the second circuit board 82. The plate spring 84 has sufficient elasticity so as not to prevent the grounding terminal 111 to be inserted into the circuit board unit 80 and to prevent the first circuit board 81 and second circuit board 82 from being broken even when the first circuit board 81 and second circuit board 82 are separated in the left-right direction in FIG. 12.

Also, in a case in which the plate spring 84 is provided as described above, dividing a circuit board that originally functions as one circuit board as the IC chip into the two circuit boards 81 and 82 without providing an overlapping component is possible. Further, in a case in which the plate spring 84 is used as the relay, the movement of the two circuit boards 81 and 82 in a direction in which the two circuit boards 81 and 82 are separated (left-right direction in FIG. 12), is not hindered. Thus, a distance between the two circuit boards 81 and 82 is appropriately maintained by the spring property and the restoring force of the plate spring 84.

Third Modification

Figure 13:
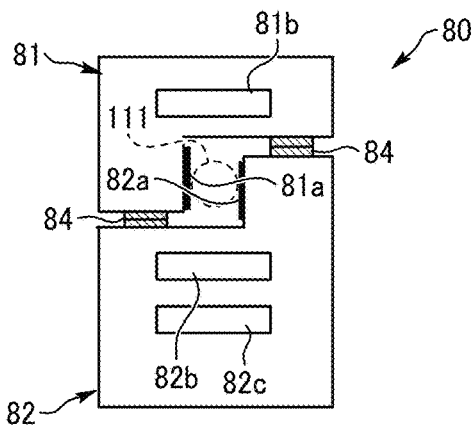
FIG. 13 is a top view of a circuit board unit according to a third modification of the above embodiments of the present disclosure.

FIG. 13 is a top view of the circuit board unit 80 according to a third modification of the above embodiments of the present disclosure.

As illustrated in FIG. 13, in the circuit board unit 80 according to the third modification, multiple relays (two flat springs 84 in the third modification) are provided on each of the first and second circuit boards 81 and 82.

Also, in a case in which a plurality of relays, i.e., plate springs 84 are provided as described above, a circuit board as the IC chip that originally functions as one circuit board can be divided into two circuit boards 81 and 82 without providing overlapping components. According to the third modification, a direction in which the two plate springs 84 are connected to the first and second circuit boards 81 and 82 is a direction (vertical direction in FIG. 13) substantially perpendicular to a direction in which the two grounding terminals 81a and 82a face each other. On the other hand, a direction in which the two plate springs 84 are connected to the first and second circuit boards 81 and 82 may be a direction (left-right direction in FIG. 13) substantially matching the direction in which the two grounding terminals 81a and 82a face each other.

Fourth Modification

Figure 14A:
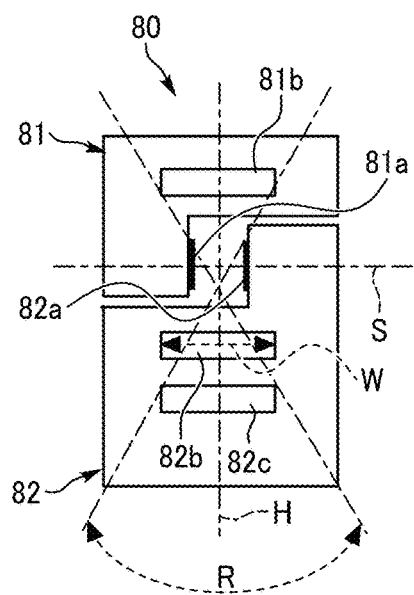
FIGS. 14A and 14B are top views of a part of a circuit board unit according to a fourth modification of the above embodiments of the present disclosure.
Figure 14B:
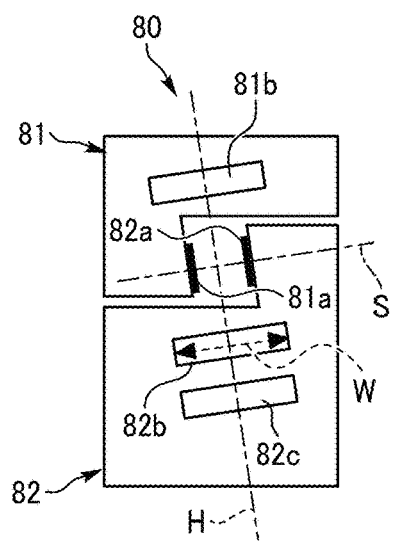

FIGS. 14A and 14B are top views of a part of the circuit board unit 80 according to a fourth modification of the above embodiments of the present disclosure.

As illustrated in FIG. 14A, the circuit board unit 80 according to the fourth modification includes a plurality of main surface terminals (81b, 82b, 82c) (the clock-signal terminal 81b, the serial-data terminal 82b, and the power-supply terminal 82c), as similarly illustrated in FIG. 9A. The clock-signal terminal 81b, the serial-data terminal 82b, and the power-supply terminal 82c are arranged at intervals in a direction (direction indicated by dot-and-dash line H) substantially perpendicular to a direction (direction indicated by dot-and-dash line S) in which the grounding terminals 81a and 82a provided on the adjacent circuit boards 81 and 82, respectively, face each other when viewed in the detachable and detachment direction of the circuit board unit 80 (direction perpendicular to the plane of FIGS. 14A and 14B).

In other words, when viewed in the detachable and detachment direction of the circuit board unit 80 as the predetermined direction, the grounding terminals 81a and 82a as the end-face terminals are substantially parallel to one virtual line, which is an arbitrary virtual line that can be drawn within range R of FIG. 14A, passing through all the main surface terminals 81b, 82b, and 82c provided on the main surfaces (upper surfaces) of the first and second circuit boards 81 and 82.

Such a configuration as described above allows the grounding terminal 111 to be inserted between the two grounding terminals 81a and 82a. Accordingly, the positions at which the second terminals (112, 113, 114) are connected to the main surface terminals 81b, 82b, and 82c, respectively, are less likely to shift in the up-and-down direction in FIG. 14A, even if a distance between the two circuit boards 81 and 82 in the left-right direction in FIG. 14A increases. The second terminals are different from the grounding terminal 111 and are the body clock-signal terminal 112, the body serial-signal terminal 113, and the power supply terminal 114. For this reason, conduction failure between the second terminals 112, 113, and 114 and the main surface terminals 81b, 82b, and 82c, respectively, can be prevented.

As illustrated in FIG. 14A, in the circuit board unit 80 according to the fourth modification, a plurality of main surface terminals, i.e., the clock-signal terminal 81b, the serial-data terminal 82b, and the power-supply terminal 82c, are arranged on the circuit boards 81 and 82, such that the longitudinal directions of the main surface terminals, i.e., directions indicated by arrow W, substantially coincide with the direction, i.e., direction indicated by dot-and-dash line S in which the grounding terminals 81a and 82a provided on the adjacent boards 81 and 82 face each other.

In other words, when viewed in the detachable and detachment direction of the circuit board unit 80 as the predetermined direction, the main surface terminals 81b, 82b, and 82c provided on the main surfaces (upper surfaces) of the first and second circuit boards 81 and 82 are arranged such that a direction substantially perpendicular to one virtual line (any virtual line that can be drawn within the range R of FIG. 14A) passing through all the main surface terminals 81b, 82b, and 82c is arranged in the longitudinal direction.

Such a configuration as described above allows the grounding terminal 111 to be inserted between the two grounding terminals 81a and 82a. Accordingly, the electrical connection between the second terminals 112, 113, and 114 and the main surface terminals 81b, 82b, and 82c, respectively, can be maintained even if a distance between and the two circuit boards 81 and 82 in the left and right direction of FIG. 14A increases and the positions at which the second terminals 112, 113, and 114 are shifted in the left and right direction of FIG. 14A. The second terminals are different from the grounding terminal 111, and are the body clock-signal terminal 112, the body serial-signal terminal 113, and the body power supply terminal 114. For this reason, conduction failure between the second terminals 112, 113, and 114 and the main surface terminals 81b, 82b, and 82c, respectively, can be prevented.

As in the circuit board unit 80 illustrated in FIG. 14B, even in a case in which the grounding terminals 81a and 82a as the end-face terminals and the main surface terminals 81b, 82b and 82c are disposed in an inclined state on the substantially rectangular main surfaces of the two circuit boards 81 and 82, the two conditions described above with reference to FIG. 14A are satisfied. Thus, conduction failure between the second terminals 112, 113 and 114 and the main surface terminals 81b, 82b, and 82c can be prevented.

Fifth Modification

Figure 15:
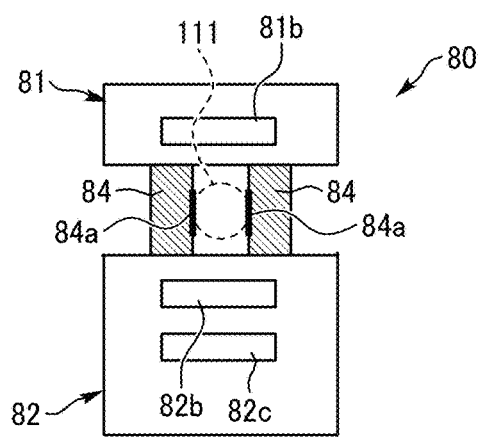
FIG. 15 is a top view of a circuit board unit according to a fifth modification of the above embodiments of the present disclosure.

FIG. 15 is a top view of the circuit board unit 80 according to a fifth modification of the above embodiments of the present disclosure.

As illustrated in FIG. 15, in the circuit board unit 80 according to the fifth modification, the first circuit board 81 and the second circuit board 82 are connected to each other by plate springs 84 as a relay that enables electrical communication between the first circuit board 81 and the second circuit board 82, as in the third modification.

In the fifth modification, each of the plate springs 84 as the relays is provided with a terminal 84a that are detachable from the grounding terminal 111 as the terminal inserted between the adjacent circuit boards 81 and 82 in conjunction with the mounting operation of the circuit board unit 80 on the image forming apparatus 100.

In the fifth modification, the terminals 84a are integrally formed with the plate springs 84 as the relays. That is, a part of the plate spring 84 formed of a conductive material (a part which contacts the grounding terminal 111) functions as the terminal 84a.

Even in such a configuration as described above, a disadvantage that the circuit board 81 mounted on the body of the image forming apparatus 100 is damaged is unlikely to occur.

In the fifth modification, each of the two plate springs 84 as the multiple relays includes a terminal 84a that are detachable from the grounding terminal 111 as the terminal in conjunction with the mounting operation of the circuit board unit 80 on the body of the image forming apparatus 100. In contrast, only one plate spring 84 or at least one relay of the multiple relays may include the terminal 84a that are detachable from the grounding terminal 111 in conjunction with the mounting operation of the circuit board unit 80 on the image forming apparatus 100.

Sixth Modification

Figure 16A:
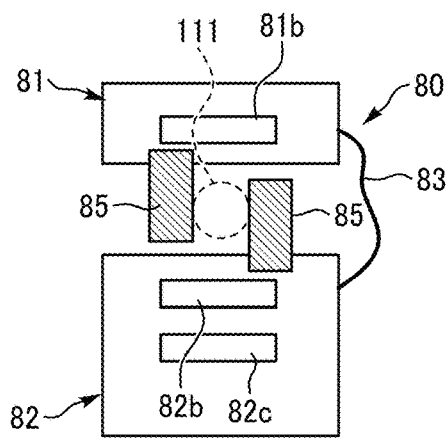
FIGS. 16A, 16B, and 16C are top views of a circuit board unit according to a sixth modification of the above embodiments of the present disclosure.
Figure 16B:
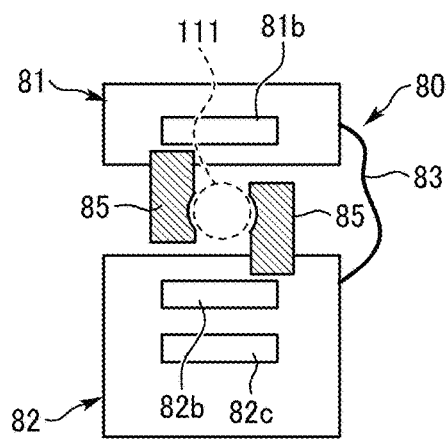
Figure 16C:
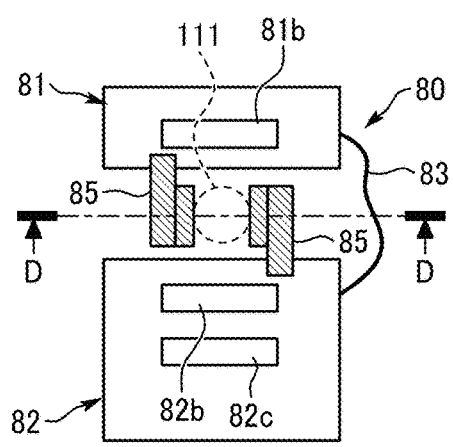
Figure 16C:
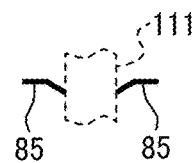

FIGS. 16A, 16B, and 16C are top views of the circuit board unit according to a sixth modification of the above embodiments of the present disclosure. FIG. 16C' is a D-D cross-sectional view of the circuit board unit 80 of FIG. 16C according to a sixth modification of the above embodiments of the present disclosure.

As illustrated in FIGS. 16A, 16B, and 16C, in the circuit board unit 80 according to the sixth modification, at least one circuit board (two circuit boards 81 and 82 in the sixth modification) of the multiple circuit boards 81 and 82 includes a circuit-board terminal 85 as a grounding terminal that are detachable from the grounding terminal 111 inserted between the adjacent circuit board 81 and circuit board 82 in conjunction with the mounting operation of the circuit board unit 80 on the image forming apparatus 100.

Specifically, the first circuit board 81 includes the circuit-board terminal 85 functioning as a grounding terminal such that the circuit-board terminal 85 protrudes toward the second circuit board 82. Similarly, the first circuit board 82 includes the circuit-board terminal 85 functioning as a grounding terminal such that the circuit-board terminal 85 protrudes toward the second circuit board 81. The circuit-board terminals 85 contact the grounding terminal 111 so as to sandwich the grounding terminal 11 inserted between the first circuit board 81 and second circuit board 82 in conjunction with the mounting operation of the circuit board unit 80.

Contact portions of the circuit-board terminals 85 illustrated in FIG. 16A are formed in a linear shape so as to point-contacts the grounding terminal 111 when viewed from the upper surface.

Each of the circuit-board terminals 85 illustrated in FIG. 16B has a contact portion formed in an arc shape so as to line-contact the grounding terminal 111 when viewed from the upper surface.

In the circuit-board terminals 85 illustrated in FIG. 16C, a bent portion functioning as a guide portion is formed in a similar manner to the grounding terminals 81a and 82a described above with reference to FIG. 11.

Even in such a configuration as described above, a disadvantage that the circuit board 81 mounted on the body of the image forming apparatus 100 is damaged is unlikely to occur.

As described above, the circuit board unit 80 according to the present embodiment is detachably mounted in a predetermined direction (detachable and detachment direction) with respect to the body of the image forming apparatus 100, and a plurality of circuit boards 81 and 82 are arranged side by side with a gap therebetween in a direction substantially perpendicular to the predetermined direction. At least one circuit board of the multiple circuit boards 81 and 82 includes the grounding terminal 81a or the grounding terminal 82a as the end-face terminals which can be connected to and disconnected from the grounding terminal 111 of the image forming apparatus 100 inserted between the adjacent circuit boards in conjunction with the mounting operation of the circuit board unit 80 to the body of the image forming apparatus 100 on an end-face facing the adjacent circuit board.

As a result, even when the circuit board 81 is mounted on the body of the image forming apparatus 100, damage to the circuit board 81 is unlikely to occur.

The above-described embodiments of the present disclosure are applied to the circuit board unit 80 installed on the toner container 32Y as the toner container in which toner is stored. However, the above embodiments of the present disclosure can also be applied to the circuit board unit 80 installed in a toner container in which ink is stored, such as an ink cartridge removably mounted on an inkjet image forming apparatus. (for example, an ink cartridge detachably installed in the image forming apparatus 100 of the ink jet system). Further, the present disclosure can be applied not only to storage containers in which toner and ink are stored. However, the present disclosure can also be applied to all circuit board units mounted on a detachable unit, for example, the developing device 5Y or a process cartridge, detachably installed on the body of an image forming apparatus.

Although IC chips are used as the circuit boards 81 and 82 in the above-described embodiments, the circuit boards 81 and 82 are not limited to circuit boards that store information. For example, an ID chip, an RFID, a printed circuit board, an IC tag, or the like can be used as the circuit board.

Further, the above-described embodiments of the present disclosure are applied to the circuit board unit 80 in which four types of terminals including the grounding terminal 81a, the clock-signal terminal 81b, the serial-data terminal 82b, and the power supply terminal 82c are provided on the circuit boards 81 and 82. However, the circuit board unit 80 to which the above embodiments of the present disclosure are applied is not limited to such a configuration. For example, the present disclosure can be applied to a circuit board unit provided with a circuit board including at least end-face terminals (81a, 82a). Furthermore, the present disclosure can also be applied to a circuit board unit in which end-face terminals (81a, 82a) other than grounding terminals are provided.

Further, the above-described embodiments of the present disclosure are applied to the circuit board unit 80 provided with the two circuit boards 81 and 82. However, the present disclosure can also be applied to a circuit board unit provided with three or more circuit boards.

Further, in the above-described embodiments, all of the multiple circuit boards 81 and 82 are provided with the grounding terminals 81a and 82a as the end-face terminals that can contact and separate from the grounding terminal 111. By contrast, only at least one circuit board (for example, the first circuit board 81) of the multiple circuit boards 81 and 82 may be provided with the grounding terminals 81a and 82a as the end-face terminals that are detachable from the grounding terminal 111.

Even in such cases as described above, the same effects as those of the embodiments of the present disclosure can be obtained.

It is obvious that the present disclosure is not limited to the embodiments described above, and the embodiments can be modified within the scope of the technical idea of the present disclosure in addition to what is suggested in the embodiments described above. Further, the number, position, and shape of the components described above are not limited to the embodiments described above. Desirable number, position, and shape can be determined to perform the present disclosure.

The suffixes Y, M, C, and K attached to each reference numeral indicate only that components indicated thereby are used for forming yellow, magenta, cyan, and black images, respectively, and hereinafter may be omitted when color discrimination is not necessary.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present disclosure.

What is claimed is:

1. A circuit board unit, comprising:
a first circuit board; and
a second circuit board electrically connected to the first circuit board, wherein
the first circuit board and the second circuit board are separated by a gap therebetween such that the first circuit board and the second circuit board are independently movable,
the first circuit board includes an end-face terminal on an end face facing the second circuit board through the gap, and
the end-face terminal is attachable to a terminal of an apparatus that is inserted into the gap in conjunction with a mounting operation of the circuit board unit to a body of the apparatus.

2. The circuit board unit according to claim 1, further comprising a relay provided separately from the end-face terminal,
wherein the relay is configured to enable electrical communication between the first circuit board and the second circuit board.

3. The circuit board unit according to claim 2, wherein the relay is a conducting wire connected to each one of the first circuit board and the second circuit board.

4. The circuit board unit according to claim 2, wherein the relay is a plate spring connected to each one of the first circuit board and the second circuit board.

5. The circuit board unit according to claim 2, further comprising a plurality of relays including the relay.

6. The circuit board unit according to claim 1, wherein
the second circuit board includes another end-face terminal, and
a distance between the end-face terminal and the other end-face terminal in a direction in which the end-face terminal and the other end-face terminal face each other is shorter than a distance between the terminal and another terminal of the apparatus in the direction in which the end-face terminal and the other end-face terminal face each other.

7. The circuit board unit according to claim 1, wherein
the end-face terminal is configured to guide the terminal of apparatus in conjunction with the mounting operation of the circuit board unit to the body of the apparatus, and
the end-face terminal is configured to elastically deform when the end-face terminal contacts the terminal of the apparatus.

8. The circuit board unit according to claim 1, wherein
the first circuit board and the second circuit board are integrated circuit (IC) chips in which a memory configured to communicate information with the apparatus is installed on at least one of the first circuit board and the second circuit board, and
the end-face terminal is a grounding terminal.

9. The circuit board unit according to claim 1, wherein
each of the first circuit board and the second circuit board includes a main surface terminal on a surface substantially perpendicular to a mounting operation direction of the circuit board unit to the body of the apparatus and is attachable to and detachable from another terminal of the apparatus in conjunction with the mounting operation of the circuit board unit to the body of the apparatus.

10. The circuit board unit according to claim 9, wherein
at least one of the first circuit board and the second circuit board includes a plurality of main surface terminals, and
the plurality of main surface terminals are disposed at intervals in a direction substantially perpendicular to the mounting operation direction.

11. The circuit board unit according to claim 9, wherein
the second circuit board includes another end-face terminal, and
main surface terminals are disposed in a manner such that a longitudinal direction of the main surface terminals substantially coincides with a direction in which the end-face terminal and the other end-face terminal face each other.

12. A detachable unit, comprising the circuit board unit according to claim 1, wherein the detachable unit is detachably installed on an image forming apparatus.

13. The detachable unit according to claim 12, wherein the detachable unit is a container configured to store toner or ink.

14. The circuit board unit according to claim 1, wherein the end face of the first circuit board faces an end-face of the second circuit board.

15. The circuit board unit according to claim 1, wherein the first circuit board and the second circuit board are movable in a direction in which a distance of the gap changes.

16. The circuit board unit according to claim 15, wherein
each of the first circuit board and the second circuit board includes a main surface terminal on a surface, and
the direction in which the distance of the gap changes is parallel to the surface.

17. The circuit board unit according to claim 16, wherein the end face and the surface are perpendicular to each other.

18. A circuit board unit, comprising:
a first circuit board; and
a second circuit board electrically connected to the first circuit board, wherein
the first circuit board and the second circuit board are separated by a gap therebetween such that the first circuit board and the second circuit board are independently movable,
the first circuit board and the second circuit board are electrically connected to each other by one or more relays disposed in the gap,
the one or more relays enable electric communication between the first circuit board and the second circuit board, and
at least one of the one or more relays includes a terminal configured to be attachable to a terminal of an apparatus that is inserted into the gap in conjunction with a mounting operation of the circuit board unit to a body of the apparatus.

19. An image forming apparatus, comprising:
a body; and
the detachable unit according to claim 12 detachably installed in the body.

20. A toner cartridge, comprising:
a circuit board unit a first circuit board and a second circuit board electrically connected to the first circuit board, wherein
the first circuit board and the second circuit board are separated by a gap therebetween such that the first circuit board and the second circuit board are independently movable, and the gap separating the first circuit board and the second circuit board in a direction substantially perpendicular to a predetermined direction in which the circuit board unit is detachably mounted to a body of an apparatus, the first circuit board includes an end-face terminal on an end face facing the second circuit board, and the end-face terminal is attachable to a terminal of the apparatus that is inserted into the gap in conjunction with the mounting operation.

\* \* \* \* \*